(12) United States Patent
Culshaw et al.

(10) Patent No.: US 9,311,206 B2
(45) Date of Patent: Apr. 12, 2016

(54) METHOD AND APPARATUS FOR MONITORING GENERAL PURPOSE INPUT OUTPUT, GPIO, SIGNALS

(71) Applicants: Carl Culshaw, Wigan (GB); Mark Maiolani, Glasgow (GB); Robert F. Moran, Largs (GB)

(72) Inventors: Carl Culshaw, Wigan (GB); Mark Maiolani, Glasgow (GB); Robert F. Moran, Largs (GB)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 148 days.

(21) Appl. No.: 14/253,399

(22) Filed: Apr. 15, 2014

(65) Prior Publication Data

US 2015/0293829 A1    Oct. 15, 2015

(51) Int. Cl.
  *H03M 13/00* (2006.01)
  *G06F 11/30* (2006.01)
  *G11C 29/42* (2006.01)
  *G11C 29/02* (2006.01)
  G11C 29/04 (2006.01)

(52) U.S. Cl.
  CPC .......... *G06F 11/3027* (2013.01); *G11C 29/022* (2013.01); *G11C 29/42* (2013.01); *G11C 2029/0409* (2013.01)

(58) Field of Classification Search
  CPC ........................... G06F 11/3027; G11C 29/42
  See application file for complete search history.

(56) References Cited

U.S. PATENT DOCUMENTS

| 6,434,650 B1 | 8/2002 | Morris et al. |
| 7,620,853 B1 | 11/2009 | Kasnavi et al. |
| 2008/0163036 A1 | 7/2008 | Kim |

FOREIGN PATENT DOCUMENTS

KR    1020080107290 A    12/2008

*Primary Examiner* — Sam Rizk

(57) ABSTRACT

An apparatus and method for monitoring general purpose input output, GPIO, signals at GPIO pins of a GPIO port of a system on chip, SoC. The apparatus comprises a first checksum generation unit adapted to generate a first checksum on the basis of GPIO bits stored in GPIO registers of the SoC, being connected via corresponding input output, IO, pad circuits to provide analog GPIO signals at the GPIO pins. A second checksum generation unit is adapted to generate a second checksum on the basis of the analog GPIO signals at the GPIO pins representing the GPIO bits. Checker logic is adapted to compare the first checksum generated by the first checksum generation unit with a second checksum generated by the second checksum generation unit.

24 Claims, 5 Drawing Sheets

US 9,311,206 B2

METHOD AND APPARATUS FOR MONITORING GENERAL PURPOSE INPUT OUTPUT, GPIO, SIGNALS

FIELD OF THE INVENTION

This invention relates to a method and apparatus for monitoring general purpose input output, GPIO, signals at GPIO pins of a GPIO port of a system on chip.

BACKGROUND OF THE INVENTION

A system on chip, SoC, is an integrated circuit, wherein different kinds of components of an electronic system are integrated on a single chip. A system on chip can comprise microprocessor cores, memory blocks, timing sources such as oscillators, interface circuits and many other circuits and components, for instance voltage regulators or power management circuits. A chip or integrated circuit on which the system on chip is integrated comprises signal pins. These pins can comprise general purpose input output pins. A group of GPIO pins can form a GPIO port of the integrated circuit. GPIO pins of an integrated circuit have no special purpose defined and are unused by default. GPIO pins are mostly found in integrated circuits and devices with pin scarcity, for instance a system on chip, embedded and custom hardware or programmable logic devices. GPIO pins can be configured to be input or output pins. It is possible that a group of pins can be switched as a group to form either an input or an output. In other integrated circuits, each GPIO pin can be set up flexibly to accept or source different logic voltages with configurable signal driving strengths and configurable pull ups and pull downs.

In conventional integrated circuits having GPIO pins, the actual GPIO signals applied to the GPIO pins are not checked in a robust manner. Conventional systems rely on the user to create a self-checking scheme, possibly by use of a redundant signal line. With increased demands on safety systems and ever more elaborate techniques to protect data, there is currently no emphasis on the actual data being written to GPIO ports or read from GPIO ports of a system on chip.

Accordingly, there is a need for a method and apparatus for monitoring general purpose input output, GPIO, signals at GPIO pins to enhance safety in a safety-critical system or environment.

BRIEF DESCRIPTION OF THE FIGURES

In the following, possible embodiments of the method and apparatus according to different aspects of the present invention are described with reference to the enclosed figures in more detail. In the figures, like reference numbers are used to identify like or functionally similar elements. The elements in the figures are illustrated for simplicity and clarity and have not necessarily been drawn to scale.

DETAILED DESCRIPTION OF EMBODIMENTS

Figure 1:
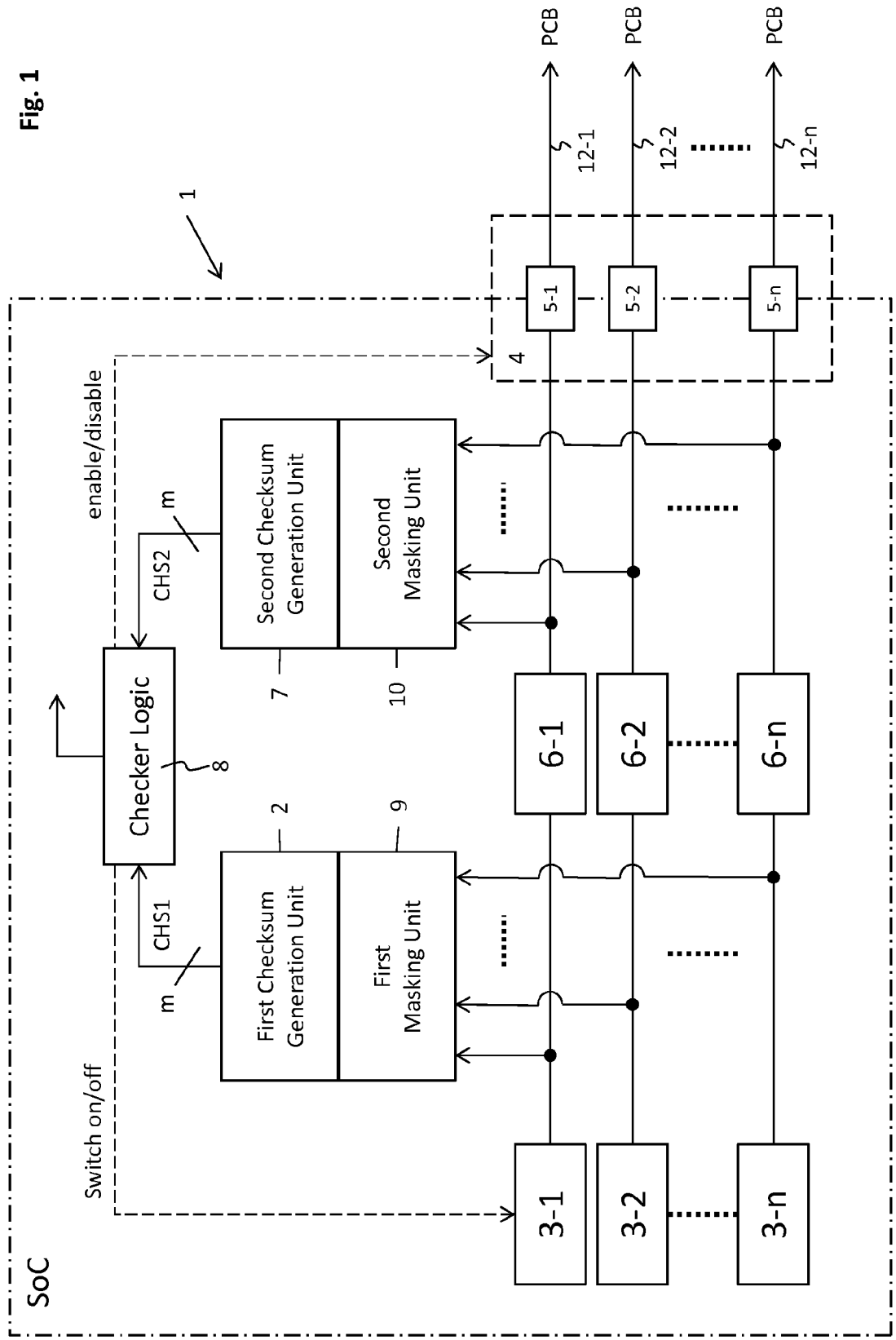
FIG. 1 shows a block diagram for illustrating a possible embodiment of an apparatus for monitoring general purpose input output, GPIO, signals according to the first aspect of the present invention.

FIG. 1 shows a block diagram illustrating a first possible embodiment of an apparatus 1 for monitoring general purpose input output, GPIO, signals at GPIO pins of a GPIO port of a system on chip, SoC. Within the shown exemplary embodiment of FIG. 1, the monitoring apparatus 1 comprises a first checksum generation unit 2 adapted to generate a first checksum CHS1 on the basis of GPIO bits stored in GPIO registers 3-1, 3-2, ..., 3-n in the system on chip, SoC. The number of GPIO registers 3-i can vary. In the embodiment shown in FIG. 1, a system on chip, SoC comprises a GPIO port 4 having n GPIO pins 5-1, 5-2, ..., 5-n. The number n of GPIO pins of the GPIO port 4 corresponds to the number of GPIO registers 3-i for the respective GPIO port. In the shown embodiment, the GPIO registers 3-i are connected via input output pad circuits 6-i to the GPIO pins 5-i. The GPIO pad circuits are adapted to provide analog GPIO signals at the GPIO pins 5-i of the GPIO port 4 corresponding to the logical values of the GPIO bits stored in the GPIO registers 3-i. In a possible implementation, the number n of GPIO pins of the GPIO port 4 is n=8.

The apparatus 1 for monitoring the general purpose input output, GPIO, signals at the GPIO pins 5-i of the GPIO port 4 comprises a second checksum generation unit 7 adapted to generate a second checksum CHS2 on the basis of the analog GPIO signals at the GPIO pins of the GPIO port representing the GPIO bits. In the shown embodiment of FIG. 1, the first checksum generation unit 2 and the second checksum generation unit 7 are both integrated on the system on chip, SoC. In a possible embodiment, the checksum generation units 2, 7 are adapted to generate an error correcting code, ECC, as checksums with a width m. The output of the first and second checksum generation unit is connected to a checker logic 8 of the apparatus 1. The checker logic 8 is adapted to compare the first checksum CHS1 generated by the first checksum generation unit 2 with a second checksum CHS2 generated by the second checksum generation unit 7 to verify a match between both received checksums CHS1, CHS2. With the apparatus 1 as illustrated in FIG. 1 it is possible to check integrity of the GPIO signals at the GPIO port 4 of the SoC. The apparatus 1 determines an expected status at the GPIO pins and constructs by means of the first checksum generation unit 2 an expected first checksum. The checker logic 8 compares the first checksum CHS1 provided by the first checksum generation unit 2 against the second checksum CHS2 generated by the second checksum generation unit 7 which corresponds to the GPIO signals monitored at the GPIO pins. The checker logic 8 can for instance check for internal routing failures. Further, PAD failures of the 10 pads 6-i within the SoC can be detected. Moreover, the checker logic 8 is adapted to detect shorts of multiple GPIO pins of the GPIO port 4.

In the embodiment shown in FIG. 1, the analog signals at the GPIO pins 5-i of the GPIO port 4 can be converted to bits representing the analog signals at the GPIO pins. The GPIO bits stored in the GPIO registers 3-i applied to the first checksum generation unit 2 are masked in a preferred embodiment by a first masking unit 9 according to a bit masking pattern. Further, the bits representing the analog signals at the GPIO pins are masked by a second masking unit 10 according to a bit masking pattern. In a possible embodiment, the first masking unit 9 and the second masking unit 10 are programmable to select GPIO pins 5-$i$ of the GPIO port 4 to be monitored. In a possible alternative embodiment, the first masking unit 9 and the second masking unit 10 can be formed by hardwired circuits to select and monitor predetermined GPIO pins of the GPIO port 4.

In a possible embodiment, if the first checksum CHS1 generated by the first generation unit 2 and the second checksum CHS2 generated by the second generation unit 7 do not match, the checker logic 8 is adapted to indicate internally a failure of the checksum comparison. In a possible implementation, the checker logic 8 can generate an internal failure comparison indication signal which can be supplied to a control unit within the system on chip SoC. Further, the checker logic 8 can be adapted to output a comparison failure indication signal via at least one dedicated checker logic pin of the system on chip SoC. In a possible embodiment, the checker logic 8 is further adapted to disable the GPIO port 4 and/or to drive the GPIO pins 5-$i$ of the GPIO port 4 to a safe I/O state by controlling the corresponding 10 pad circuit 6-$i$, if the first checksum generated by the first checksum generation unit 2 and the second checksum generated by the second checksum generation unit 7 do not match. In a still further possible embodiment, the checker logic 8 is further adapted to switch off the GPIO registers 3-$i$, if the first and second checksum do not match. In a further possible embodiment, the first checksum CHS1 generated by the first checksum generation unit 2 and the second checksum CHS2 generated by the second checksum generation unit 7 can be communicated via dedicated pins of the system on chip SoC or across a standard serial port of the system on chip or another communication interface. The masking units 9, 10 can be used to determine which of the GPIO pins 5-$i$ of the SoC device are to be monitored and only those desired and selected GPIO pins are checked by the checker logic 8. In a possible embodiment, the checker logic 8 monitors and controls individually the pin behavior and signal characteristics of the analog signals such as pull up time, pull down time, rise time, etc. at the different GPIO pins 5-$i$ of the GPIO port 4. The checker logic 8 can signal a detected error to request or force the system on chip SoC such as a microcontroller unit, MCU, into a safe state or can gate the I/O change to block it based on an assumed or detected error or it can force the GPIO port 4 to a known safe state based on the detected error. In the embodiment shown in FIG. 1, the checker logic 8 is integrated on the system on chip, SoC. In alternative embodiments, the checker logic 8 can also be an external unit connected to the system on chip. The reaction time of the checker logic 8 is very low and the necessary actions are triggered very fast in real time. In a possible embodiment the apparatus 1, in particular its checker logic 8 operates at a very high processing rate being higher by a predetermined factor than processing rate of the remaining circuitry of the system on chip.

Figure 2:
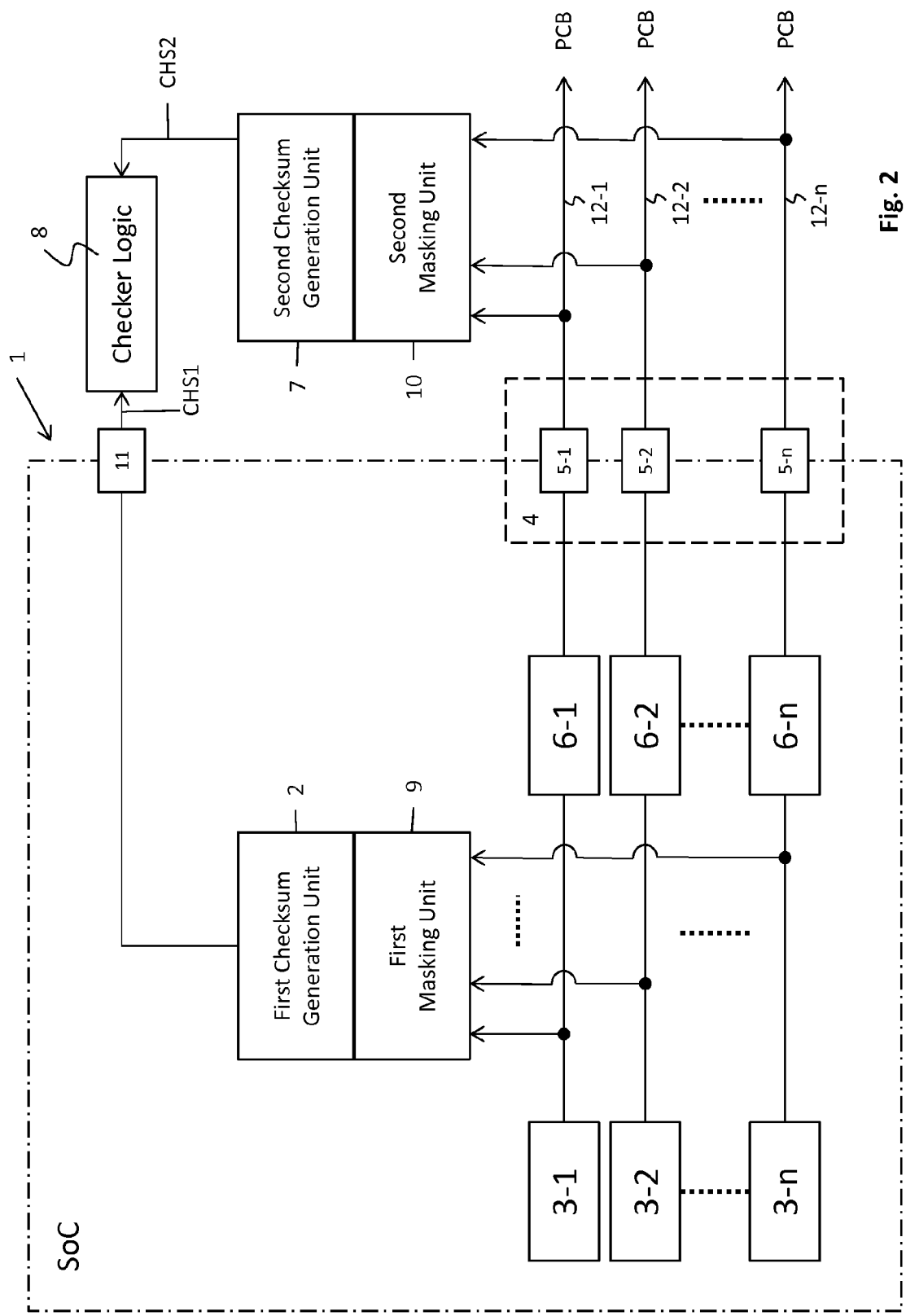
FIG. 2 shows a block diagram of a further possible embodiment of an apparatus for monitoring general purpose input output, GPIO, signals according to the first aspect of the present invention.

FIG. 2 shows an alternative embodiment, where the checker logic 8 is not integrated on the system on chip SoC but connected to the system on chip SoC by means of checkbit pins as illustrated in FIG. 2. In the embodiment of FIG. 2, also the second checksum generation unit 7 and its masking unit 10 are external units connected to the GPIO pins 5-$i$ of the GPIO port 4. The GPIO signals at the GPIO pins 5-$i$ are connected via signal lines 12-$i$ to electronic components on a printed circuit board, PCB. These electronic components form electric loads connected to the GPIO port 4. The second masking unit 7 is connected to the signal lines 12-$i$ as illustrated in FIG. 2. In a possible embodiment, the analog signals on the signal lines 12-$i$ are first converted into bits representing the analog signals and then the converted bits are masked according to a bit masking pattern by the second masking unit 10 to select GPIO pins 5-$i$ of the GPIO port 4 to be monitored. In a possible embodiment, the external checker logic 8 is adapted to indicate a failure of the checksum comparison to an external control unit or to a control unit integrated on the same system on chip, SoC, to disable the GPIO port 4 or to drive the GPIO pins 5-$i$ to a safe I/O state by controlling the corresponding I/O pad circuits 6-$i$. Further, the external checker logic 8 can also be adapted to switch off the internal GPIO registers 3-$i$ of the system on chip, SoC, if the first and second checksum do not match each other. In a further embodiment adding more redundancy, an external driver circuit is provided through which the I/O pad outputs pass. In the event of the checker logic detecting a fail, it does automatically disable this external device, thereby making safe the external circuit paths.

Figure 3:
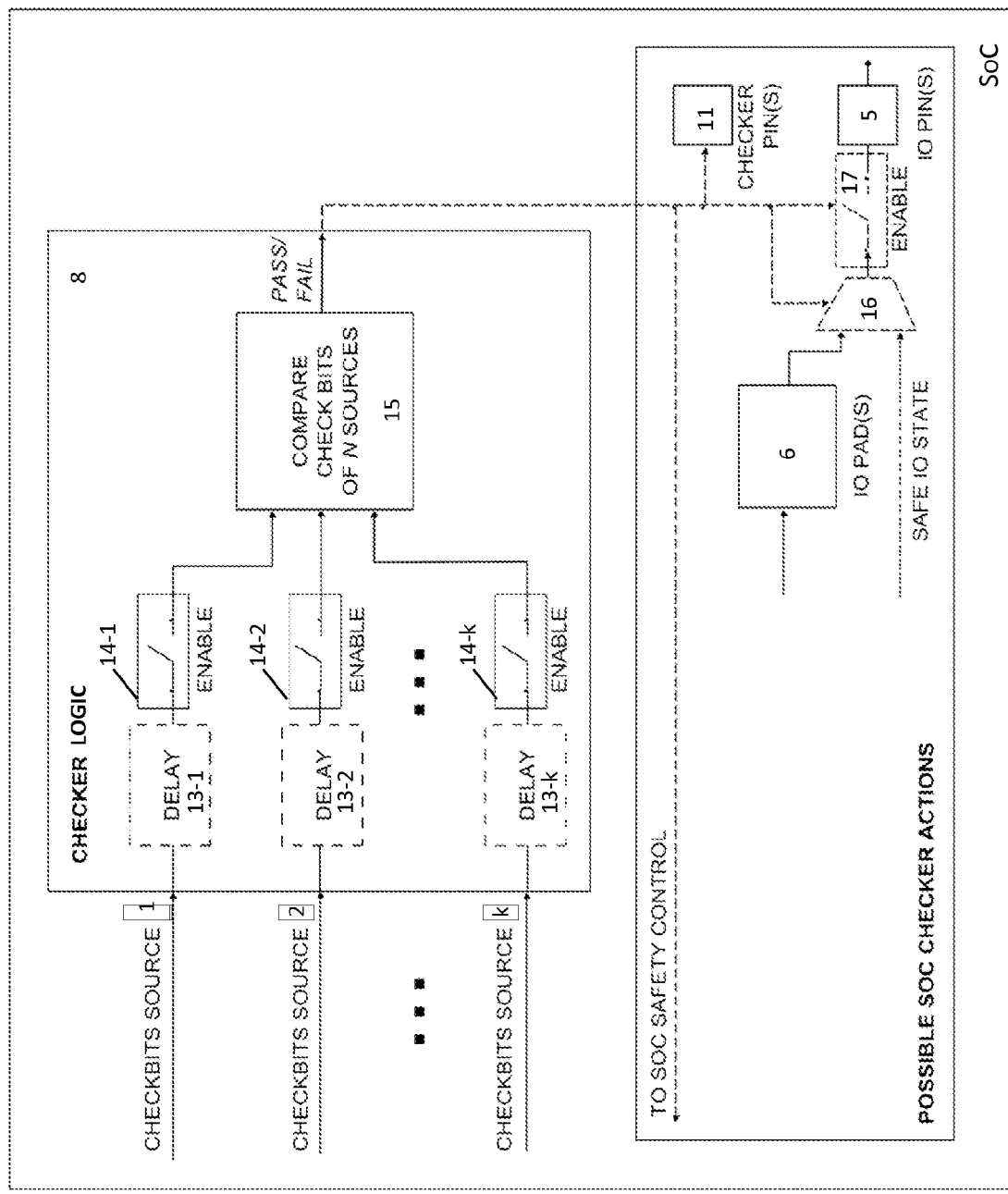
FIG. 3 shows a block diagram for illustrating a possible implementation of a checker logic within an apparatus for monitoring general purpose input output, GPIO, signals according to the first aspect of the present invention.

FIG. 3 illustrates the operation of the checker logic 8 in more detail. The checker logic 8 can receive generated checksums from different checksum generation units or checksum source entities which can be located internal or external to the system on chip SoC. In possible embodiments, delay circuits 13-$i$ are provided to adapt delay the checksums received by the checker logic 8 from k different check sum sources or checksum generation units with a predetermined or an adjustable delay time as illustrated in FIG. 3. By providing the delay circuits 13-$i$ routine, propagation and/or transition delays can be taken into account. The outputs of the delay circuits 13-$i$ can be switched off individually by means of switches 14-$i$ of the checker logic 8. Further, the checker logic 8 comprises a comparator 15 which compares the enabled check sum bits received from the checksum generation units. The comparator 15 can generate a pass/fail control signal which in a possible embodiment is output via checker logic pins 11 to an external circuit. Further, the pass/fail control signal generated by the comparator of the checker logic 8 can be used to drive the GPIO pins 5-$i$ of the GPIO port 4 into a safe I/O state by controlling a gate circuit 16 and/or an enable switch 17 as illustrated in FIG. 3. Further, the pass/fail control signal can be supplied to a safety control circuit integrated on the system on chip SoC.

Figure 4:
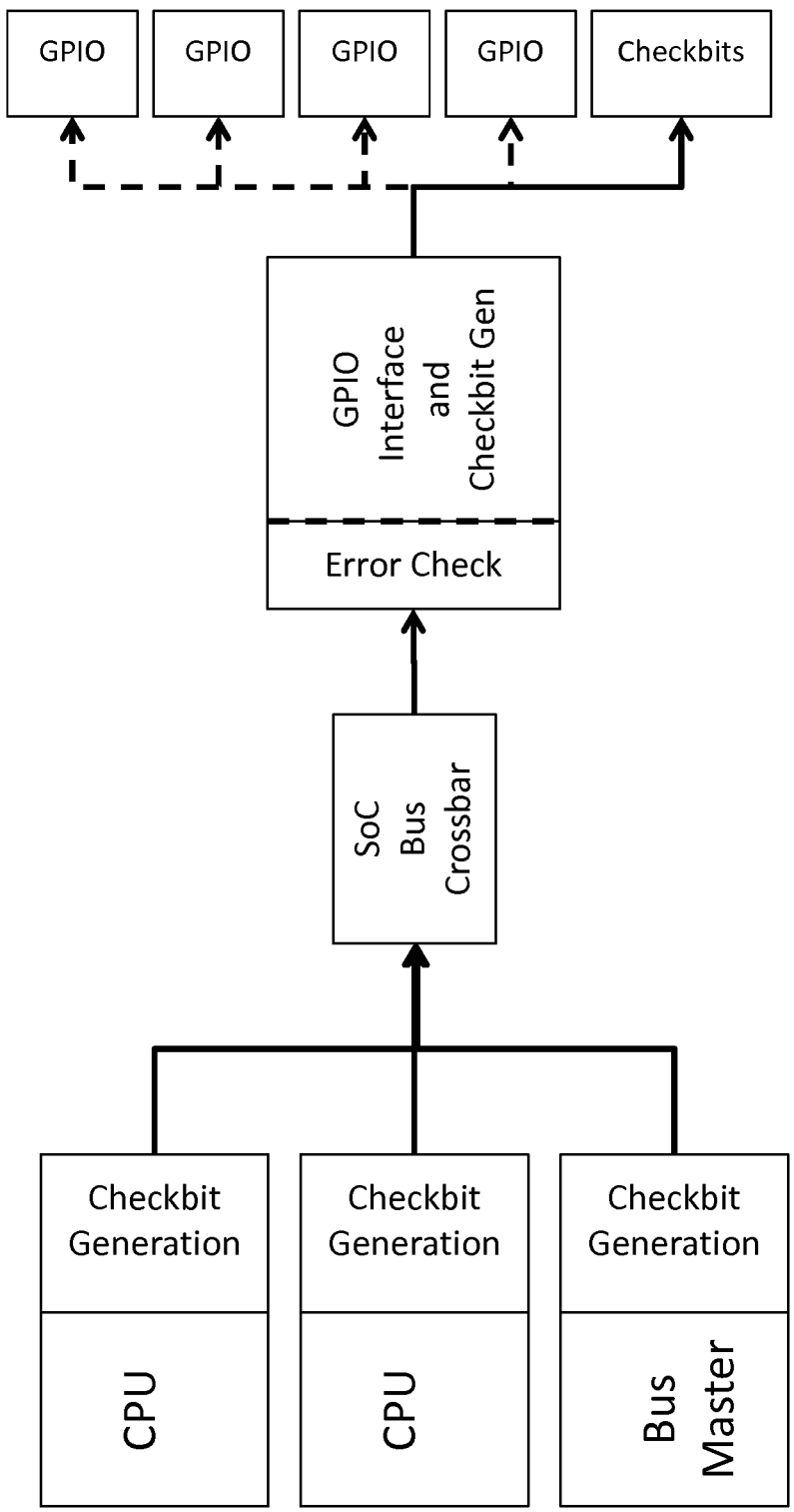
FIG. 4 shows a further simplified block diagram for illustrating the operation of an apparatus for monitoring general purpose input output, GPIO, signals according to the first aspect of the present invention.

FIG. 4 illustrates the extension provided by the apparatus 1 according to the first aspect of the present invention in a system on chip SoC. The system on chip SoC can comprise different checkbit generation units of central processing units CPU or a bus master as illustrated in FIG. 4. The bits can be transmitted via a SoC bus crossbar to an error checking entity extended by a GPIO checker apparatus according to the first aspect of the present invention connected to the GPIO pins.

Figure 5:
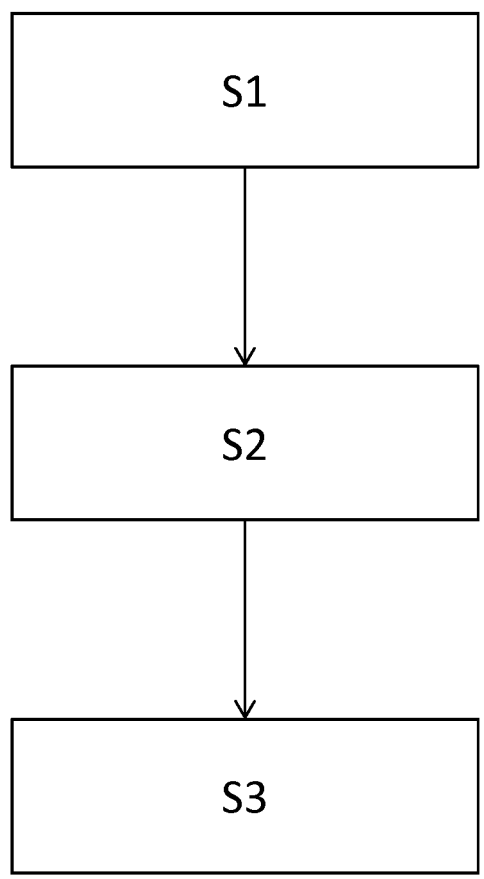
FIG. 5 shows a flowchart of a possible embodiment of a method for monitoring general purpose input output, GPIO, signals according to a further aspect of the present invention.

FIG. 5 shows a flow chart diagram for illustrating a possible embodiment of a method for monitoring general purpose input output, GPIO, signals at GPIO pins of a GPIO port of a system on chip SoC according to a further aspect of the present invention.

In a first stage S1, a first checksum CHS1 is generated depending on GPIO bits which can be stored temporarily in GPIO registers of the system on chip SoC. In a further stage S2, a second checksum CHS2 is generated depending on analog GPIO signals, in particular voltage signals, at GPIO pins of at least one GPIO port representing the stored GPIO bits. The analog signals at the GPIO pins of the GPIO port can be converted to bits representing the analog signals at the GPIO pins.

In a further third stage S3, the first checksum CHS1 and the second checksum CHS2 are compared to each other to verify a match between both checksums CHS1, CHS2.

In a possible embodiment of the method according to the present invention, the GPIO bits stored in the GPIO registers are masked according to a predetermined or programmable bit masking pattern for generating the first checksum CHS1 in stage S1. Further, the analog signals converted in stage S2 to bits representing the analog signals at the GPIO pins can be first masked using a predetermined or programmable bit masking pattern. In stage S3, if the first checksum CHS1 and the second checksum CHS2 do not match, a failure is indicated internally to a control unit and a comparison failure indication signal can be output via at least one dedicated checker logic pin of the system on chip. Further, in a possible embodiment, if the first checksum CHS1 and the second checksum CHS2 are found as not matching each other in stage S3, the GPIO port can be disabled and/or the GPIO pins of the GPIO port can be driven to a safe I/O state. Further, in stage S3, if the first checksum CHS1 and the second checksum CHS2 do not match, the GPIO registers can be switched off automatically. The first checksum CHS1 generated in stage S1 and the second checksum CHS2 generated in stage S2 can in a possible embodiment be delayed with a predetermined or adjustable delay time. Further, the first checksum CHS1 generated in operation S1 and the second checksum CHS2 generated in stage 2 can be communicated via dedicated pins of the system on chip SoC or across a standard serial port of the system. In a possible embodiment, a first checksum CHS1 generated in stage S1 and a second checksum CHS2 generated in stage S2 are formed both by an error correcting code, ECC. The checksums can also be transmitted to a receiving device, either on-chip or off-chip. The independent checker logic 8 verifies checkbits against input levels on GPIO pads. A checker delay may be included to avoid a false detection due to delay in changes of voltage levels caused by external signal loading. With the method and apparatus according to the present invention, an end-to-end ECC scheme can be introduced for the GPIO ports of a system on chip SoC such as a microcontroller unit, MCU. The generated checksums can be communicated across a standard serial port such as a serial peripheral interface, SPI.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-ROM or diskette, stored with data loadable in a memory of a computer system, the data representing the computer program. The data carrier may further be a data connection, such as a telephone cable or a wireless connection.

The term "program", as used herein, is defined as a sequence of instructions designed for execution on a computer system. A program, or computer program, may include a subroutine, a function, a procedure, an object method, an object implementation, an executable application, an applet, a servlet, a source code, an object code, a shared library/dynamic load library and/or other sequence of instructions designed for execution on a computer system.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

In particular, it is to be understood that the implementations of the apparatuses depicted herein are merely exemplary, and that in fact many other implementations achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

A system on chip (SoC) referred to in the above description may be understood as representative of system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Other modifications, variations and alternatives leveraging the teaching of the description departing of the present application and departing from the embodiments illustrated above may also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An apparatus for monitoring general purpose input output, GPIO, signals at GPIO pins of a GPIO port of a system on chip, SoC, said apparatus comprising:
 a first checksum generation unit adapted to generate a first checksum on the basis of GPIO bits stored in GPIO registers of said system on chip, SoC, being connected via corresponding input output, IO, pad circuits to provide analog GPIO signals at the GPIO pins of the GPIO port;
 a second checksum generation unit adapted to generate a second checksum on the basis of the analog GPIO signals at the GPIO pins of the GPIO port representing the GPIO bits; and
 a checker logic adapted to compare the first checksum generated by said first checksum generation unit with a second checksum generated by the second checksum generation unit to verify a match between both checksums.

2. The apparatus according to claim 1,
wherein the GPIO bits stored in the GPIO registers applied to said first checksum generation unit are masked by a first masking unit according to a bit masking pattern.

3. The apparatus according to claim 2,
wherein the analog signals at the GPIO pins of the GPIO port are converted to bits representing the analog signals at the GPIO pins.

4. The apparatus according to claim 3,
wherein the bits representing the analog signals at the GPIO pins are masked by a second masking unit according to a bit masking pattern.

5. The apparatus according to claim 4,
wherein the first masking unit and the second masking unit are programmable to select GPIO pins of the GPIO port to be monitored.

6. The apparatus according to claim 5,
wherein the first masking unit and the second masking unit are formed by a hardwired circuit to select GPIO pins of the GPIO port to be monitored.

7. The apparatus according to claim 1,
wherein if the first checksum generated by the first generation unit and the second checksum generated by the second generation unit do not match, the checker logic is adapted to indicate internally a failure of the checksum comparison to a control unit of the system on chip, SoC, and/or to output a comparison failure indication signal via at least one dedicated checker logic pin of the system on chip, SoC.

8. The apparatus according to claim 1,
wherein if the first checksum generated by the first checksum generation unit and the second checksum generated by the second checksum generation unit do not match, the checker logic is adapted to disable the GPIO port and/or to drive the GPIO pins to a safe I/O state by controlling the corresponding IO pad circuits.

9. The apparatus according to claim 1,
wherein if the first checksum generated by the first checksum generation unit and the second checksum generated by the second checksum generation unit do not match, the checker logic is adapted to switch off the GPIO registers.

10. The apparatus according to claim 1,
wherein the checker logic is an internal checker logic integrated in said system on chip, SoC, or is an external checker logic connected to the system on chip, SoC.

11. The apparatus according to claim 1,
wherein the second checksum generation unit and the second masking unit are integrated in said system on chip, SoC, or form external units connected to the GPIO pins of the GPIO port of said system on chip, SoC.

12. The apparatus according to claim 1,
wherein delay circuits are provided adapted to delay the first checksum and/or the second checksum received by the checker logic with a predetermined or adjustable delay time.

13. The apparatus according to claim 1,
wherein the checksum generation units are adapted to generate error correcting codes, ECC, as checksums compared by a comparator of said checker logic.

14. The apparatus according to claim 1,
wherein the first checksum generated by the first checksum generation unit and/or the second checksum generated by the second checksum generation unit are communicated via dedicated pins of said system on chip, SoC, and/or across a standard serial port of said system on chip, SoC, or other communication interface.

15. A microcontroller unit, MCU, comprising at least one apparatus according to claim 1.

16. A method for monitoring general purpose input output, GPIO, signals at GPIO pins of a GPIO port of a system on chip, SoC, said method comprising:
 generating a first checksum depending on GPIO bits stored in GPIO registers of said system on chip;
 generating a second checksum depending on analog GPIO signals at GPIO pins of the GPIO port representing the GPIO bits; and
 comparing the first checksum and the second checksum to verify a match between both checksums.

17. The method according to claim 16,
wherein the analog signals at the GPIO pins of the GPIO port are converted to bits representing the analog signals at the GPIO pins and masking the bit representing the analog signals using a predetermined or programmable bit masking pattern.

18. The method according to claim 16,
wherein the GPIO bits stored in the GPIO registers are masked according to a predetermined or programmable bit masking pattern.

19. The method according to claim 16,
wherein if the first checksum and the second checksum do not match, a failure is indicated internally to a control unit and/or a comparison failure indication signal is output via at least one dedicated checker logic pin of the system on chip, SoC.

20. The method according to claim 16,
wherein if the first checksum and the second checksum do not match, the GPIO port is disabled and/or the GPIO pins of the GPIO port are driven to a safe I/O state.

21. The method according to claim 16,
wherein if the first checksum and the second checksum do not match, the GPIO registers are switched off.

22. The method according to claim 16,
wherein the first checksum and/or the second checksum are delayed with a predetermined or adjustable delay time.

23. The method according to claim 16,
wherein the first checksum and the second checksum are communicated via dedicated pins of the system on chip, SoC, and/or across a standard serial port of the system on chip, SoC.

24. The method according to claim 16,
wherein the first checksum and the second checksum are formed by error correcting codes, ECC.

* * * * *